United States Patent [19]

Denzene

[11] 4,114,102
[45] Sep. 12, 1978

[54] RADIO CHANNEL SKIP SYSTEM

[75] Inventor: Quentin S. Denzene, Waseca, Minn.

[73] Assignee: E. F. Johnson Company, Waseca, Minn.

[21] Appl. No.: 753,684

[22] Filed: Dec. 23, 1976

[51] Int. Cl.² .............................................. H04B 1/32
[52] U.S. Cl. ................................... 325/470; 325/465
[58] Field of Search ............... 325/335, 453, 464, 465, 325/468, 469, 470

[56] References Cited

U.S. PATENT DOCUMENTS

| 3,714,585 | 1/1973 | Koch | 325/464 |
| 3,824,475 | 7/1974 | Pflasterer | 325/470 |
| 3,961,267 | 6/1976 | Weissmueller, Jr. | 325/470 |

*Primary Examiner*—Robert L. Griffin
*Assistant Examiner*—Marc E. Bookbinder
*Attorney, Agent, or Firm*—Warren A. Sturm; Hugh D. Jaeger

[57] ABSTRACT

A rapid channel skip system for radio receiver having a single channel skipping switch to inhibit the radio receiver from receiving any of selected channels of a plurality of channels of predetermined frequencies while scanning repetitively those channel selected to be received. A clock oscillator having a scan frequency controls the scanning time of channels to be received and a skip oscillator having a skip frequency oscillates for one cycle to skip over a channel. The channel skipping switch is utilized to skip, inhibit, bypass, look around, etc., any channel of a plurality of channels a listener does not wish to receive when the rapid channel skip system connected between the squelch control and the oscillator of the radio receiver has stopped on a channel while scanning in the scan mode or has been stepped to a particular channel by the channel stepping switch in the manual mode by actuating the switch. If the channel skipping switch is actuated a second time when utilizing resettable memory elements on an inhibited channel in the manual mode, the channel is enabled. The channel stepping switch is not usable in the scanning mode. A received channel may be skipped in the scanning mode on the next scanning cycle by actuating the channel skipping switch while that channel is receiving a signal. In the manual mode of operation, each channel is skipped by actuating the channel skipping switch setting a memory for each channel to be skipped. When going from the manual mode to scan mode, the memory having been set determines those channels to be received and those channels to be skipped. A reset switch resets all channel memories which are set or inhibited.

30 Claims, 2 Drawing Figures

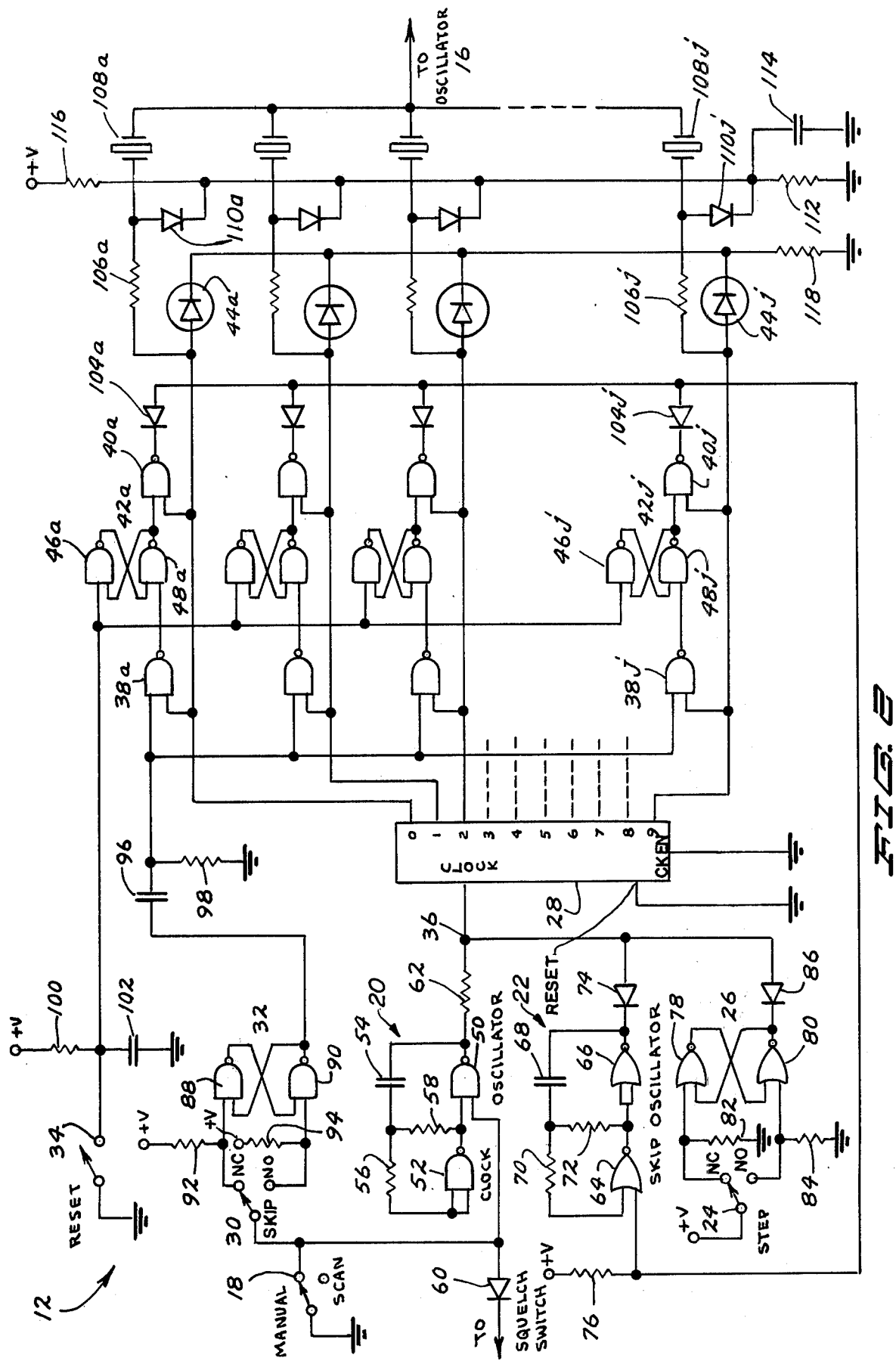

RADIO CHANNEL SKIP SYSTEM

BACKGROUND OF THE INVENTION

1. Field of the Invention

The present invention relates generally to a radio receiver having a squelch circuit, and more particularly pertains to a new and improved circuit for a rapid channel skip system for a radio receiver wherein any predetermined frequencies also known as channels having a plurality of channels can be skipped, inhibited, bypassed, looked around, etc., by inhibiting any predetermined channels of a plurality of channels in a first manual or automatic scanning cycle which are subsequently skipped in second and subsequent scanning cycles.

2. Description of the Prior Art

In the field of scanning radio receivers, it has been a general practice to employ a plurality of switches for an equal plurality of channels to lock out, disable, etc., any channels of predetermined frequencies such as a police frequency, fire frequency, sheriff frequency, highway patrol frequency, etc., and a single clock oscillator to control the scanning frequency of all the channels.

The most common type of lockout, disable, etc., switches employed are slide or pushbutton switches which are slid, or pushed in or out to an on position to lockout, disable, etc., any predetermined channels. A separate slide or pushbutton switch is employed for each separate channel to lockout each channel. These types of switches or any type of a plurality of switches in general are time consuming to utilize in addition to presenting certain maintenance problems to keep the switches in an operational condition.

A typical scanning radio receiver using a plurality of lockout switches, one switch per channel, is described in a patent issued to Boone et al, U.S. Pat. No. 3,883,808, issued on May 13, 1975, entitled "Radio".

A typical scanning radio receiver using a multi speed clock is described in a patent issued to Koch, U.S. Pat. No. 3,714,585, issued on Jan. 30, 1973, entitled "Scanning Radio Having Rapid Channel Skipping Capability." The frequency of the multi speed clock is controlled by each individual channel skip switch for each respective channel to skip locked out channels at a fast rate. When a channel is skipped, the channel visual indication device glows dimly.

This invention eliminates the use of a separate switch for each of the plurality of channels by providing a single channel skipping, inhibiting, bypass, look around, channel choice, etc., switch for all of the channels used in conjunction with a memory for each channel which stores status information as to whether the channel is electronically turned "on" or "off."

Also, this invention uses two separate oscillators, a clock oscillator at a scanning frequency to scan channels to be received and a skip oscillator at a skipping frequency to skip inhibited frequencies by advancing the counter to the next channel in conjunction with a single channel skipping switch. The advancement is at a frequency such that the crystal is unable to stabilize into oscillation and the visual indicating device will not light.

SUMMARY OF THE INVENTION

The present invention obviates the foregoing disadvantages of the prior art by providing a single channel skipping switch for a plurality of channels having crystals of predetermined frequencies to be scanned in a radio receiver having a squelch control such as in a frequency modulated receiver. The term skipping also encompasses the terms bypass, inhibiting, look around, choice of channel, etc., and is not to be construed as limiting in its own sense or in the sense of these other terms. Also, the present invention provides a clock oscillator to control the scanning frequency of channels to be received and a skip oscillator to control the frequency of skipping inhibited channels.

According to one embodiment of this invention, there is provided a rapid channel skip system for scanning a plurality of channels having crystals of predetermined frequencies in a radio receiver and having a single channel skipping switch to select the receiving of any channel of a plurality group of channels of predetermined frequencies when used in conjunction with a channel stepping switch to step each channel in numerical sequence, an oscillator to control the scanning frequency of channels to be received, a skip oscillator control to control the frequency to skip inhibited channels and advance the control to the next channel, a counter, a manual-scan switch to utilize either the manual or the scan mode of operation, logic gates, bistable multivibrators used as a memory for each channel of choice to be skipped, diodes, and crystals, for each of a plurality of channels to oscillate at predetermined frequencies, and a reset switch to reset all channel memories which are set or inhibited. Further, light emitting diodes are provided for each individual channel as a visual indication of each respective channel being received.

A significant aspect and feature of this invention is that only a single channel skipping switch is required to inhibit, skip, bypass, look around, choice of a channel, program, etc., any of the plurality of channels in contrast to the prior art which uses one lockout, disable, etc., switch for each of the individual channels. The use of one switch provides better reliability and lower costs by eliminating each switch per channel.

Another significant aspect and feature of this invention is that a clock oscillator controls the scanning of channels to be received at one frequency and a skip oscillator controls channels to be skipped by advancement of the counter at another frequency which is higher than the scanning frequency thereby eliminating and recovering scan time normally lost on an inhibited channel.

An additional feature of the invention is the utilization of bistable multivibrators, one for each channel, as a solid state memory with gating functions for each channel to provide the channel skipping capability for skipping any of the channels eliminating the need for individual lockout, disable, etc., switches. The solid state memory consists of a bistable multivibrator comprising two NAND gates and logic gates comprising two additional NAND gates, a total of four NAND gates for each channel memory. The memory is set in the manual mode or while receiving a channel in the scan mode. The memory also holds status information regarding the on-off status for each particular channel. Resettable memory elements such as J-K flip-flops may also be used as a solid state memory.

Having briefly described the embodiment of the present invention, it is a principal object thereof to provide a rapid channel memory system utilizing a single channel skipping switch to select channels of respective predetermined frequencies in radio receiver where the channels are scanned repetitively and cyclically in regular sequence by separate oscillators to control the frequency of the scanning of channels to be received and the skipping of inhibited channels. The circuitry easily lends itself to a single integrated circuit or more depending upon the number of channels.

An object of the present invention is the provision of a radio receiver having a squelch control with a rapid channel memory system to scan a plurality of channels which eliminates the need for individual channel disable, lockout, etc., switch for each individual channel. This is advantageous from an economic standpoint.

Another object is the provisions in the rapid channel skip system having a manual-scan switch and a channel stepping switch for use with a radio receiver to repeatively scan a plurality of channels, a single channel stepping switch so an operator can step to and select by his own choice with a channel skipping switch those channels that he desires to receive and those channels that he desires to skip, bypass, inhibit, look around, etc. When the manual-scan switch is in the manual position, the manual-scan switch permits manual stepping of each channel in ascending numerical order for the plurality of channels of predetermined frequencies such as a police frequency, fire frequency, highway patrol frequency, etc. If the operator wishes to skip a channel through his own choice, when the channel skip switch is actuated to skip that channel and inhibit the channel skip memory system in the radio receiver from again receiving that channel during scanning on the next scan cycle of all the channels. If the channel skipping switch is actuated a second time when utilizing a resettable memory element in the manual mode after that channel is inhibited, then the channel is uninhibited and is not skippped, bypassed, programmed out, or looked around during that next scanning cycle. When the manual-scan switch is in the scan position, the channel skipping system scans all the channels in numerical order and skips those inhibited channels. When a signal is received from the squelch control of the radio receiver to dwell on a received channel in the scan position, that received channel can thereupon be skipped by pressing the channel skipping switch and that channel is skipped as the squelch control no longer receives a signal as the crystal of that channel no longer oscillates.

An additional object of the invention is the provision of a separate clock oscillator to control the frequency of the scanning of channels to be received and a separate skip oscillator to control the frequency for the advancement of the counter to the next channel for each of channels to be skipped. The skip oscillator is of such a frequency that the crystals for each predetermined frequency can't oscillate to become stable at the first oscillator frequency for a particular channel and any visual indication devices will not light or even glow dimly.

A still additional object is the provision of not falsing a channel by using separate clock and skip oscillators. The skip oscillator is immune to extraneous noise on the inhibited channel as the skip oscillator is enabled for only one cycle to address the counter to the next channel. Previous scanned channels can not be falsed.

A further object of the invention is the provision of a solid state memory used along with logic gating functions for each individual channel to electronically memorize whether the channel when scanned is to be received or skipped, and to electronically act as an electronic channel on-off switch in lieu of a manual on-off switch respectively. The memory is a bistable multivibrator and is set by actuating the channel skipping switch only while the scanning radio receiver is receiving a channel in the scan mode or is stepped to a channel in the manual mode. Also, the memory in the manual mode after actuating the channel skipping switch to inhibit a channel can again be pressed a second time to enable the respective inhibited channel if a resetable memory element is utilized. The memory can be utilized as a status indicator to indicate whether the channel is programmed to receive a channel or is programmed to inhibit a channel.

A still additional object is the provision in the scan mode of operation, the channel stepping switch is disabled so that the memories for the channels can not be changed. In the scan mode, a received channel may be skipped by actuating the channel skipping switch while stopped on and receiving a particular channel, and the scanning will resume with that particular channel being skipped in the subsequent scanning cycle.

A still further object of the invention is the provision of visual indication for each of the channels being received whether in the automatic channel scanning mode or in the manual channel stepping mode. Further, visual indication can be provided to indicate whether a channel is enabled or inhibited; that is, its status as to whether the channel is to be received or skipped.

BRIEF DESCRIPTION OF THE DRAWING

Other objects and many of the attendant advantages of this invention will be readily appreciated as the same becomes better understood by reference to the following detailed description when considered in connection with the accompanying drawings, in which like reference numerals designate like parts through the figures thereof and wherein:

FIG. 2 illustrates a circuit schematic of the invention.

DESCRIPTION OF THE PREFERRED EMBODIMENTS

Figure 1:
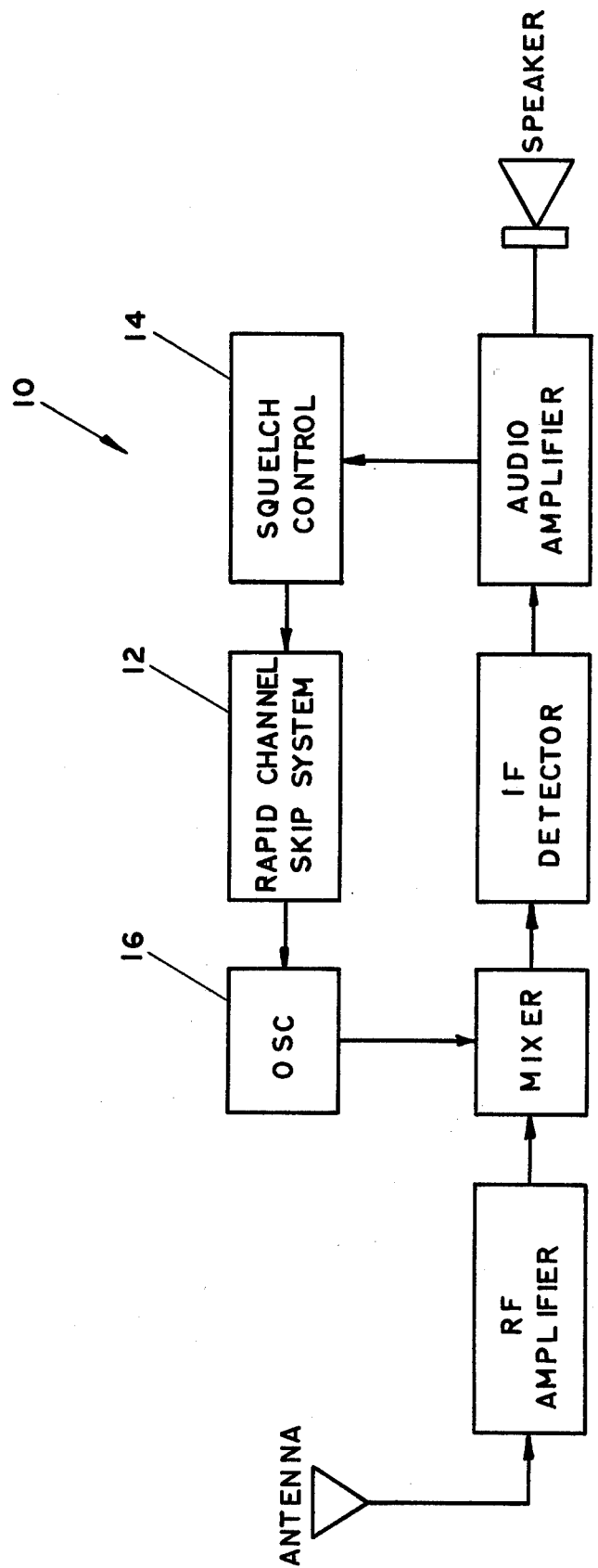
FIG. 1 illustrates a block diagram of the preferred embodiment of the invention.

FIG. 1 illustrates a block diagram of a radio receiver 10 showing a rapid channel skip system 12 for skipping any preselected channels and electrically connects between a squelch control circuit 14 and an oscillator 16 in the radio receiver 10. The radio receiver 10 may also use an antenna, a radio frequency amplifier, a mixer, an intermediate frequency amplifier, an audio amplifier, and a speaker which are all respectively labeled on the block diagram of the figure.

FIG. 2 illustrates a circuit diagram of a rapid channel skip system 12 for skipping any preselected channels. The circuitry of the channel skip memory system 12 of this invention consists of a manual-scan switch 18, a free running gate clock oscillator 20, a free running gate skip oscillator 22, a channel stepping switch 24, a cross coupled NOR bistable multivibrator debounce circuit 26, a counter 28, a channel skipping switch 30, a cross coupled NAND bistable multivibrator 32, a reset switch 34, logic gages 36, 38a–38j, 40a–40j, light emitting diodes 44a–44j, and crystals 108a–108j, to oscillate at any predetermined frequencies such as a police frequency for channel 1, a fire frequency for channel 2, a highway patrol frequency for channel 3, etc., up to channel 10. The electrical connection of these and other interconnected components is now described in detail with reference being made to the figure.

In FIG. 2, a free running clock oscillator 20 is an astable multivibrator where the ouput of a NAND gate 50 connects to both inputs of a NAND gate 52 through a series connection of a capacitor 54 and a resistor 56. A resistor 58 connects from the junction of the capacitor 54 and the resistor 56 to the junction of the output of NAND gate 52 and one of the inputs of NAND gate 50. The frequency of the clock oscillator 20 is determined by the values of the capacitor 54 and the resistors 56 and 58. A diode 60 having its anode connected to the other input of NAND gate 50 connects the rapid channel skip system 12 to the squelch control of the radio receiver 10. A coupling resistor 62 connects the output of NAND gate 50 to a clock input of counter 28.

A double pole single throw manual-scan switch 18 having a manual position and a scan position connects from the other input of NAND gate 50 and the anode of diode 60 to ground in the manual position. The manual-scan switch 18 connects to a normally open contact in the scan position.

A momentary single pole double throw channel skipping switch 30 connects from the other input of NAND gate 50 to a resistor 92 through normally closed contacts of channel skipping switch 30. Voltage source V may be any suitable source of voltage compatible with the type of circuitry utilized.

A slip oscillator 22 is an astable multivibrator where the output of NOR gate 64 connectes to both inputs of NOR gate 66. A capacitor 68 and a resistor 70 connect in series from the output of NOR gate 66 to one of the inputs of NOR gate 64. A resistor 72 connects from the junction of the capacitor 68 and the resistor 70 to the junction of the output of NOR gate 64 and the inputs of NOR gate 66. The frequency of the skip oscillator 22 is determined by the values of the capacitor 68 and the resistors 70 and 72. A diode 74 having its cathode connected to the output of NOR gate 66 connectes to the clock input of the counter 28. A pull up resistor 76 connects between the voltage source V and the other input of NOR gate 64.

A momentary single pole double throw channel stepping switch 24 having a normally closed contact connects between the voltage source V and the other input of NOR gate 78. A normally open contact of channel stepping switch 24 connects to the other input of NOR gate 80. The two cross coupled NOR gates 78 and 80 form a bistable multivibrator 26. The output of NOR gate 78 connects to one of the inputs of NOR gate 80 and the output of NOR gate 80 connects to one of the inputs of NOR gate 78. Resistors 82 and 84 connect from the normally closed and normally open contacts of channel stepping switch 24 respectively to ground to provide the set input for the NOR gates 78 and 80. A diode 86 has its cathode connected to the output of NOR gate 80 and its anode to the clock input of the counter 28.

A "DOT OR" or "WIRED OR" logic gate 36 is formed by the wired junction of coupling resistor 62, the cathode of diode 74, and the cathode of diode 86 at the clock input to the counter 28.

Two cross coupled NAND gates 88 and 90 form a bistable multivibrator which eliminates bounce from channel skipping switch 30. The output of NAND gate 88 connects to one of the inputs of NAND gate 90 and the output of NAND gate 90 connects to one of the inputs of NAND gate 88. The momentary single pole double throw channel skipping switch 30 having a normally closed contact connects between the other input of NAND gate 88 and the junction of the manual position of the manual scan switch 18, the other input of NAND gate 50, and the anode of diode 60. The normally open contact of channel skipping switch 30 connects to the other input of NAND gate 90. Resistors 92 and 94 connect from the voltage source V to the normally open and normally closed contacts of the channel skipping switch 30 to provide the set input for the NAND gates 88 and 90.

A counter 28 having decoded outputs "0," "1," etc., to "9" comprise 10 designated channels to cyclically control the scanning for ten predetermined frequencies corresponding to ten channels. The reset and the clock enable connect to ground. The number of decoded outputs comprising an equal number of channels for predetermined frequencies is not to be construed as limiting in any sense as ten channels is only used for purposes of illustration and example. The total number of channels is only limited by the number of decoded outputs of the counter 28 which may have any number of channels such as 8, 10, 16, etc., or more if more than one counter is wired together for a larger number of channels. The counter 28 is clocked by the circuitry of the clock oscillator 20 and the skip oscillator 22.

The circuitry associated for each individual separate channel corresponding to a predetermined frequency is identical to that of the other channels, so for purposes of illustration and description, the circuitry for each channel indicated by alphabetical designation $a$-$j$ of its respective decoded input of ten channels is hence described.

The output corresponding to each individual channel of the counter 28 connects to an input of NAND gates 38$a$-38$j$, one for each of the ten channels; to an input of NAND gates 40$a$-40$j$, one for each of the ten channels; and the anode of light emitting diodes 44$a$-44$j$, one for each channel. The cathodes of light emitting diodes 44$a$-44$j$ connect to a current limiting resistor 118 which connects to ground. A coupling capacitor 96 connects between the other inputs of NAND gates 38$a$-38$j$ and the output of multivibrator 32. A resistor 98 connects from the other inputs of NAND gates 38$a$-38$j$ to ground.

Two cross coupled NAND gates 46$a$-46$j$ and 48$a$-48$j$, one for each channel, form bistable multivibrators 42$a$-42$j$, one for each channel. The output of NAND gates 46$a$-46$j$ connects to one of the inputs of NAND gates 48$a$-48$j$ and the output of NAND gates 48$a$-48$j$ connects to one of the inputs of NAND gates 46$a$-46$j$. The output of NAND gates 38$a$-38$j$ connects to the other input of NAND gates 48$a$-48$j$. A momentary single pole single throw reset switch 34 connects between the other input of NAND gates 46$a$-48$j$ and ground. Resistor 100 connects from the voltage source V to the other input of NAND gates 46$a$-46$j$ to provide a reset input for bistable multivibrators 42$a$-42$j$. Bypass capacitor 102 connects from the other inputs of NAND gates 46$a$-46$j$ to ground to supress transients. The other input of NAND gates 40$a$-40$j$, one for each channel, connects to the output of NAND gates 48$a$-48$j$ of the bistable multivibrators 42$a$-42$j$. The other input of each of the NAND gates 40$a$-40$j$ connects to the output for each channel of the counter 28 and the input of NAND gates 38$a$-38$j$, respectively. Diodes 104$a$-104$j$, one for each channel, connect between the output of NAND gates 40$a$-40$j$ with all the anodes being connected to the input of NOR gate 64 of skip oscillator 22. The NAND gates 38$a$-38$j$, 40$a$-40$j$, 46$a$-46$j$, and 48$a$-48$j$ may be an integrated circuit for each channel normally containing four logic NAND gates, one for each channel; two logic NAND gates 38 and 40 and the remaining two for the bistable multivibrator 42 consisting of NAND gates 46 and 48.

A J-K flip-flop or any other type of solid state resettable memory element may be substituted for NAND gates 38a–38j, 46a–46j, and 48a–48j, one J-K flip-flop for each channel. The J and K inputs tie together to form a toggle flip-flop and connect to each respective channel output of the counter 28. The clock input connects to the output of the bistable multivibrator 32 through capacitor 102. The reset input connects to the reset switch 34. The Q output of each J-K flip-flop connects to the input of NAND gates 40a–40j.

Resistors 106a–106j, one for each channel, connect between the anodes of the light emitting diodes 44a–44j, the inputs of NAND gates 40a–40j, the inputs of NAND gates 38a–38j, and each respective counter output to one side of crystals 108a–108j where there is an individual crystal of a predetermined frequency for each separate individual corresponding channel for the 10 channels in this particular example. The other side of crystal 108a–108j all connect to the oscillator 16 of radio receiver 10 as illustrated in FIG. 1.

Diodes 110a–110j, one for each channel, having its respective anode connected between each junction of resistors 106a–106j and crystals 108a–108j with its cathode connected to a resistor 112 which connects to ground. A capacitor 114 connects in parallel with resistor 112. A resistor 116 connects between the cathode of diodes 110a–110j, the resistor 112 and the capacitor 114 to the voltage source V.

PREFERRED MODE OF EMBODIMENT

Rapid channel skip system 12 scans a plurality of predetermined frequencies designated as respective channels, in numerical order, ten in this instance for way of example and illustration only. The number of channels is not to be construed as limiting in any sense as the number of channels may be more or less in number, and is only limited by the number of counters and outputs of each respective counter. When a radio frequency (rf) carrier signal is received by the radio receiver 10, the output of squelch control 14 forward biases diode 60 of rapid channel skip system 12 pulling the input to the clock oscillator 20 low thereby stopping the clock oscillator 20 in turn stopping the scanning by counter 28 on the particular channel being received.

In the scanning mode, the radio receiver 10 dwells or receives on a particular channel when an rf signal is present corresponding to the frequency of the crystal for that particular channel being received. When the rf signal is no longer received for a predetermined time as determined by the electrical characteristics of the squelch control circuitry 14, diode 60 is reversed biased, the input voltage to the clock oscillator 20 from the diode 60 goes high, and the oscillator clock 20 again starts running in turn advancing the counter 28 for scanning each individual channel in numerical sequence by the channel skipping system in the radio receiver 10. The clock oscillator 20 is enabled or disabled by either the squelch circuitry through diode 60 of the radio receiver 10 or the manual-scan switch 18.

During the scanning mode when the manual-scan switch 18 is in the scan position, each channel is momentarily switched 'ON' and 'OFF' in numerical sequence at a rate of 16 Hertz for example, as determined by the time constant of values of the capacitor 54 and the resistors 56 and 58 which control the frequency of the oscillator clock 20 consisting of NAND gates 50 and 52. The pulses from the clock oscillator 20 are continuously applied to the clock input of counter 28 to sequentially energize each of the decoded outputs "0," "1," "2," etc., to 10 of the counter 28 corresponding to the ten channels. Each output of the counter is used to forward bias on the light emitting diodes 44a–44j and the silicon diodes 110a–110j. Assuming that none of the channels are inhibited and are therefore skipped, bypassed, looked around, etc., the ten outputs from the counter 28 are respectively applied to the ten NAND gates 38a–38j, the 10 NAND gates 40a–240j, the anode of the diodes 44a–44j, and to the silicon diodes 110a–110j through the resistors 106a–106j. The silicon diodes 110a–110j acts as electronic switches to switch the respective crystals 108a–108j to the alternating current ground through capacitor 114 thereby starting the oscillator 16 of the radio receiver 10 to oscillate when each of the ten respective channel outputs of counter 28 are energized. The resistors 106a–106j limit the current for the switching diodes 110a–110j and prevent high frequency from the crystals 108a–108j from feeding back into the circuitry. The high output of the counter 28 turns "on" in order the diodes 110a–110j further turning "ON" each respective channel having a crystal of a predetermined frequency such as police, fire, highway patrol, etc., for the oscillator 16 of the radio receiver 10. The diodes 110a–110j are in effect electrical channel "ON"-"OFF" switches for the crystals 108a–108j corresponding to the individual channels. The diodes 110a–110j are forward biased through the resistors 106a–106j to provide an alternating current path for the crystals 108a–108j to ground. When any channel is not being scanned or received, resistor 116 reverse biases the diodes 110a–110j for the respective unreceived or unscanned channels to prevent random oscillations of crystals 108a–108j for the respective channels. The scanning operation of the rapid channel skip system 12 continues in numerical sequence for each channel as the advancing of the counter 28 proceeds from output "0" to output "9" corresponding to the 10 channels in this particular example whereupon the counter resets itself back to zero to cyclically repeat the scanning process in seriatim.

In the scan mode of operation when the manual-scan switch 18 is set to the scan position, the clock oscillator 20 is always oscillating at 16 Hertz unless there is a signal from squelch control circuit 14 to forward bias the diode 60 thereby stopping the oscillator clock 20 and changing from a high to low signal to the input of the clock oscillator 20. As described, each of the 10 channels are momentarily turned "ON" and "OFF" in seriatim. When a signal is received by squelch control circuitry 14 from the radio receiver 10, it forward biases the diode 60 and the clock oscillator 20 stops the counter 28 on that particular channel of a predetermined frequency. The channel may then be skipped, inhibited, looked around, bypassed, etc., on its next scanning cycle by actuating the momentary double pole single throw channel skipping switch 30. The channel skipping switch 30 generates a short pulse through bistable multivibrator 32 and programs one of the bistable multivibrators 42a–42j or any other suitable memory element the particular one for the respective received channel, through NAND gates 38a–38j, the particular one for the respective received channel. The channel skipping switch 30 is enabled by a lowline and applies a signal to the other input of all of the particular NAND gates 38a–38j along with a signal to the input of the particular NAND gates 38a–38j for the respective channel from the output of the counter 28. The respective NAND gates 38a–38j provide a low input to the other input of NAND gates 48a–48j of the bistable multivibrators 42a–42j for the respective channel being received causing the bistable multivibrators 42a–42j to reverse its state, so that there will be a high output from the output terminal of NAND gates 48a–48j of the bistable multivibrators 42a–42j thereby resulting in a subsequent low output when a signal is applied to the input of NAND gates 40a–40j from the outputs of counter 28.

The memory elements are in this instant case, cross coupled NAND gates, 46a–46j and 48a–48j, forming gated S-R flip-flops, one for each channel. The outputs of the bistable multivibrators 42a–42j are gated with the outputs of the counter outputs 28, respectively to produce a negative pulse only when a channel memory element 42a–42j has been set to be skipped, etc., and when the respective channel is addressed by the counter 28. The pulse enables the skip oscillator 22 through the diodes 104a–104j connected to form an AND gate to step the counter up one channel through the diode 74.

When the skip oscillator 22 oscillates, the diode 74 is foward biased momentarily dropping the clock input of the counter 28 from high to low advancing the counter 28 to the next channel. The skip oscillator oscillates at 4 kilohertz for example. This in turn changes the input to the previous channel of NAND gates 40a–40j from a high to a low and raises the output of the NAND gate from a low to a high thereby reverse biasing the diodes 104a–104j through the pull up resistor 76. Since the original channel is now off and the output of the respective NAND gates 40a–40j is high, the skip oscillator 22 is disabled through the respective diodes 104a–104j. The skipping action and feedback is so fast that the inhibited crystal 108a–108j is not able to oscillate to become stable and the associated LED 44a–44j is not able to light. Therefore, the channel appears to have been skipped over during that particular clock cycle. Since the skip oscillator 22 is separate from the clock oscillator 20, it is not possible to false an inhibited channel as any channel skipped by skip oscillator 22 is not able to oscillate. When the skip oscillator addresses and advances the counter, the respective diode for the previous channel is not permitted to become stable to oscillate at its respective predetermined frequency. On each subsequent scanning cycle, the inhibited channel is skipped by the skip oscillator 22 and the associated logic gates and the scan time normally lost on an inhibited channel is subsequently recovered.

In the manual mode of operation when the manual-scan switch 18 is set to the manual position, the clock oscillator 20 stops and the rapid channel skip system 12 of the radio receiver 10 ceases to automatically scan the plurality of channels by pulling the input to the clock oscillator 20 low. Depressing the reset switch 34 resets all of the bistable multivibrators 42a–42j, which has been disabled to skip any preselected channels. All the channels may in turn be stepped in sequence upward one at a time by manually stepping or in effect cyclically advancing the counter 28 via bistable multivibrator 26 consisting of two cross coupled NOR gates 78 and 80 connected to the counter 28 by diode 86 depressing momentary single pole double throw stepping switch 24 once for each channel to be stepped in numerical sequence. Any of the channels to which the counter 28 has been stepped and advanced to may be skipped, inhibited, etc., by depressing the channel skipping switch 30. The skipping switch is enabled by a low line. Momentarily depressing the skipping switch 30 sets the memory 42a–42j associated with the stepped to channel. Light emitting diodes 44a–44j light for the particular channel stepped to provide a visual indication for that respective channel.

In the manual mode of operation, the operator of the rapid channel skip system 12 of the radio receiver 10 may inhibit one or more of the channels one at a time while manually stepping through the channels in numerical sequence. The channel skipping switch 30 is utilized and operates as previously explained for the scan mode of operation. To skip a channel in the manual mode, channel skipping switch 30 is actuated resulting in a signal applied to the other input of NAND gates 38a–38j concurrently with a signal received from the respective output of the counter 28 to the input of NAND gates 38a–38j to provide a signal to the other input of NAND gates 48a–48j of bistable multivibrators 42a–42j for that particular stepped to channel to reverse its state so that there shall be a high output from the output terminal of NAND gates 48a–48j of the bistable multivibrators 42a–42j. Therefore, any signal applied to the input of NAND gates 40a–40j shall not be passed to forward bias diodes 104a–104j resulting in that particular channel being skipped.

J-K flip-flops or any other type of resettable memory elements may be substituted for the bistable multivibrator 42a;14 42j consisting of NAND gates 46a–46j and 48a–48j where one J-K flip-flop is substituted for each channel as previously described. In using a single line resettable memory, the channel skipping switch 30 may be actuated for a second time to enable an inhibited channel so that the channel will not be skipped, etc., if any operator makes the status change. The channel skip switch 30 toggles the J-K flip-flop when the J and K inputs are both high and when the channel is being addressed by the counter being at the respective channel output.

The bistable multivibrators 42a–42j provide solid state programmable memory so that when the manual-scan switch 18 is switched from a manual position to a scan position, the inhibited channels are skipped, by-passed, looked around, etc., by the solid state memory of the bistable multivibrators 42a–42j through subsequent action of the skip oscillator 22.

Various modifications are contemplated and may obviously be resorted to by those skilled in the art without departing from the spirit and scope of the invention, as hereinafter defined by the appended claims, as only a preferred embodiment thereof has been disclosed. Light emitting diodes, one for each channel used as a visual status indicator of an addressed channel, may also connect to the bistable multivibrators 42a–42j or J-K flip-flops, whichever is utilized as the programmable electronic solid state memory, to indicate the status of each individual channel as to whether the channel is turned on to receive a rf signal or programmed to be turned off so as to skip, etc., the respective channel. the status light for each channel would indicate whether the channel is turned on being enabled or turned off being skipped.

Having thus described the invention, there is claimed as new and desired to be secured by Letters Patent:

1. Rapid channel skip system for use in a radio receiver and connected in said receiver between a squelch control and an oscillator comprising
   (a) manual-scan means having a manual mode of operation and a scan mode of operation;
   (b) clock oscillator means connected to said manual-scan means;
   (c) means connecting said clock oscillator means to said squelch control of said radio receiver;
   (d) counter means connected to said clock means and having a plurality of outputs, each of said outputs corresponding to an individual channel of a predetermined frequency;
   (e) skip oscillator means connected to said counter means;
   (f) plurality of first logic means having two inputs, one of said inputs of each of said first logic means connected to each of said plurality of outputs of said counter;
   (g) channel skipping means connected between said manual-scan means and the other of said inputs of each of said first logic means;
   (h) plurality of memory means having two inputs, one of said inputs of each of said memory means connected to each output of said plurality of first logic means;
   (i) reset means connected to the other of said inputs of each of said memory means;
   (j) plurality of second logic means having two inputs, one of said inputs of each of said second logic means connected to the output of said memory means and the other of said inputs of each of said plurality of second logic means connected to each respective output of said plurality of outputs of said counter;
   (k) first plurality of diodes connected between each of the outputs of said plurality of second logic means and said skip oscillator means, and;
   (l) second plurality of diodes respectively connected to each of said counter outputs, said one input of said first logic means, and said other input of said second logic means;
   (m) plurality of crystals of predetermined frequencies, one crystal per channel, connected between each of said second plurality of diodes and said oscillator whereby said clock oscillator means drives said counter to cyclically scan and receive seriatim each of said channels in regular sequence and a voltage differential received by said connecting means stops said clock oscillator means to receive the radio frequency signal on a particular channel scanned and whereby activating said channel skipping means while receiving the signal on the particular channel generates a short pulse to set said memory means so that the channel is inhibited and skipped on subsequent scanning cycles by enabling said skip oscillator means for each scanning cycle on said inhibited channel.

2. Rapid channel skip system of claim 1 wherein said manual-scan means comprises a single pole double throw manual-scan switch.

3. Rapid channel skip system of claim 1 wherein said clock oscillator means comprises an astable multivibrator.

4. Rapid channel skip system of claim 3 wherein said astable multivibrator comprises two end-coupled NAND logic gates.

5. Rapid channel skip system of claim 1 wherein said connecting means comprises a diode having its anode connected to said manual-scan means and said clock means and its cathode connected to said squelch conrtrol.

6. Rapid channel skip system of claim 1 wherein said counter means comprises a clock input connected to said clock means, a reset input and a clock enable input connected to ground whereby said counter when counting in numerical sequence automatically resets itself to cyclically scan said plurality of channels seriatim.

7. Rapid channel skip system of claim 1 wherein said skip oscillator means comprises an astable multivibrator.

8. Rapid channel skip system of claim 1 wherein said plurality of first logic means comprises an equal plurality of NAND logic gates.

9. Rapid channel skip system of claim 1 wherein said plurality of memory means comprises an equal plurality of bistable multivibrators.

10. Rapid channel skip system of claim 9 wherein each of said bistable multivibrators comprises two cross-coupled NAND logic gates for each of said plurality of multivibrators.

11. Rapid channel skip system of claim 1 wherein said plurality of second logic means comprises an equal plurality of NAND logic gates.

12. Rapid channel skip system of claim 1 further comprising a plurality of visual indicating means, each of said plurality of visual indicating means connecting to each of said plurality of outputs of said counter to provide visual indication when each channel is scanned, manually or automatically.

13. Rapid channel skip system of claim 12 wherein each of said visual indicating means comprises a light emitting diode.

14. Rapid channel skip system of claim 1 wherein the combination of said plurality of first logic means and memory means comprises an equal plurality of resettable said plurality of memory elements.

15. Rapid channel skip system of claim 14 wherein each of said resettable memory elements comprises a J-K flip-flop whereby said J-K inputs connect to said counter output, a clock input of said J-K flip-flop connects to said channel skipping means, a reset input connects to said reset means, and an output connects to said input of said second logic means.

16. Rapid channel skip system of claim 1 wherein said skip oscillator means frequency is at least two hundred times greater than said oscillator frequency.

17. Rapid channel skip system of claim 1 further comprises a plurality of status indication means connected to each of said plurality of memory means.

18. Rapid channel skip system of claim 1 wherein said status indicating means comprises a light emitting diode for each of said plurality of memory means.

19. Rapid channel skip system of claim 1 further comprising a plurality of memory means whereby said status indication means indicates the enable and inhibit status of each channel.

20. Rapid channel skip system of claim 1 further comprising said crystals having one connection of each crystal connected to each of said second plurality of diodes and the other connection of each of said plurality of crystals connected in common to said oscillator of said radio receiver.

21. Rapid channel skip system of claim 1 wherein said skip oscillator means frequency is 4 KHz and said oscillator means frequency is 16 Hz.

22. Rapid channel skip system of claim 1 wherein said channel skipping means comprises a momentary single pole double throw switch.

23. Rapid channel skip system of claim 1 further comprising a channel stepping means and pulse means connected between said channel stepping means and said counter whereby said stepping means actuates said counter through said pulse means each time said stepping means is actuated to manually advance the counter through each channel sequentially.

24. Rapid channel skip system of claim 23 wherein said channel stepping means comprises a momentary single pole double throw switch.

25. Rapid channel skip system of claim 23 wherein said pulse means comprises a bistable multivibrator.

26. Rapid channel skip system of claim 23 wherein said pulse means comprises a cross-coupled NAND gate flip-flop.

27. Rapid channel skip system of claim 1 wherein said reset means comprises a momentary single pole double throw switch whereby depressing said switch resets all of said memory means which had been disabled to skip any preselected channels.

28. Rapid channel skip system of claim 1 wherein said clock oscillator means drives said counter to cyclically scan and receive seriatim each of said channel in a regular sequence at a slow rate and said skip oscillator means skips each inhibited channel at a fast rate to recover scan time normally lost on the inhibited channel.

29. Rapid channel skip system of claim 1 wherein said channel skipping means can inhibit on actuation channels received in the scan mode, and inhibit channels sequentially stepped to by said counter means in said manual mode and subsequentially skipped when sequentially scanned in the scan mode.

30. Rapid channel skip system of claim 1 wherein said channel skipping means upon actuation in the manual mode can enable an inhibited channel.

* * * * *